US011651955B2

(12) United States Patent
Pandey et al.

(10) Patent No.: US 11,651,955 B2
(45) Date of Patent: *May 16, 2023

(54) METHODS OF FORMING SILICON NITRIDE INCLUDING PLASMA EXPOSURE

(71) Applicant: Micron Technology, Inc., Boise, ID (US)

(72) Inventors: Sumeet C. Pandey, Boise, ID (US); Brenda D. Kraus, Boise, ID (US); Stefan Uhlenbrock, Boise, ID (US); John A. Smythe, Boise, ID (US); Timothy A. Quick, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/215,958

(22) Filed: Mar. 29, 2021

(65) Prior Publication Data

US 2021/0217611 A1    Jul. 15, 2021

Related U.S. Application Data

(60) Continuation of application No. 15/857,920, filed on Dec. 29, 2017, now Pat. No. 10,964,532, which is a
(Continued)

(51) Int. Cl.
*H01L 21/02* (2006.01)

(52) U.S. Cl.
CPC ...... *H01L 21/0228* (2013.01); *H01L 21/0217* (2013.01); *H01L 21/0234* (2013.01);
(Continued)

(58) Field of Classification Search
CPC .................. H01L 21/0228; H01L 21/0217
(Continued)

(56) References Cited

U.S. PATENT DOCUMENTS 7,125,582 B2    10/2006    McSwiney et al.
8,647,993 B1    2/2014    Lavoie et al.
(Continued)

FOREIGN PATENT DOCUMENTS

| CN | 1464530 A   | 12/2003 |
| CN | 105568249 A | 5/2016  |
| CN | 104046955 A | 12/2018 |

OTHER PUBLICATIONS

Second Chinese Office Action for Application No. 201710691033.9, dated Apr. 6, 2021, 17 pages.
(Continued)

*Primary Examiner* — Quoc D Hoang
(74) *Attorney, Agent, or Firm* — TraskBritt (57) ABSTRACT

Methods of forming silicon nitride. Silicon nitride is formed on a substrate by atomic layer deposition at a temperature of less than or equal to about 275° C. The as-formed silicon nitride is exposed to a plasma. The silicon nitride may be formed as a portion of silicon nitride and at least one other portion of silicon nitride. The portion of silicon nitride and the at least one other portion of silicon nitride may be exposed to a plasma treatment. Methods of forming a semiconductor structure are also disclosed, as are semiconductor structures and silicon precursors.

20 Claims, 3 Drawing Sheets

Related U.S. Application Data division of application No. 15/235,365, filed on Aug. 12, 2016, now Pat. No. 9,865,456.

(52) U.S. Cl.
CPC .. *H01L 21/02211* (2013.01); *H01L 21/02219* (2013.01); *H01L 21/02312* (2013.01)

(58) Field of Classification Search
USPC .......................................................... 257/632
See application file for complete search history.

(56) References Cited

U.S. PATENT DOCUMENTS

| | | | |
|---|---|---|---|
| 9,214,333 B1* | 12/2015 | Sims | .................. C23C 16/52 |
| 9,385,318 B1 | 7/2016 | Henri | |
| 9,865,456 B1* | 1/2018 | Pandey | .............. H01L 21/0234 |
| 10,964,532 B2* | 3/2021 | Pandey | .............. H01L 21/0234 |
| 2012/0213940 A1 | 8/2012 | Mallick | |
| 2014/0023794 A1 | 1/2014 | Mahajani et al. | |
| 2014/0141542 A1 | 5/2014 | Kang et al. | |
| 2014/0273531 A1 | 9/2014 | Niskanen et al. | |
| 2015/0235834 A1 | 8/2015 | Han et al. | |
| 2015/0259791 A1 | 9/2015 | Hausmann et al. | |
| 2016/0079054 A1 | 3/2016 | Chen et al. | |
| 2016/0093484 A1 | 3/2016 | Marsh | |
| 2017/0062204 A1* | 3/2017 | Suzuki | ................ H01L 21/0217 |

OTHER PUBLICATIONS

Chinese Reexamination Notification for Application No. 201710691033.9, dated Feb. 24, 2022, 11 pages.

Chinese Third Office Action for Application No. 201710691033.9, dated Aug. 9, 2021, 13 pages.

Chinese Office Action for Application No. 201710691033.9, dated Jul. 23, 2020, 15 pages.

Lin et al., Silicon Nitride Films Deposited by Atmospheric Pressure Chemical Vapor Deposition, Mat. Res. Soc. Symp. Proc. vol. 495, (1998), pp. 107-112.

Meng et al., Atomic Layer Deposition of Silicon Nitride Thin Films: A Review of Recent Progress, Challenges, and Outlooks, Materials, vol. 9 Issue 12, (2016), http://www.mdpi.com/1996-1944/9/12/1007/htm, 38 pages.

Taiwanese Office Action and Search Report for Taiwanese Application No. 106127287, dated Apr. 24, 2018, 13 pages with English translation.

\* cited by examiner

METHODS OF FORMING SILICON NITRIDE INCLUDING PLASMA EXPOSURE

CROSS-REFERENCE TO RELATED APPLICATIONS

This application is a continuation of U.S. patent application Ser. No. 15/857,920, filed Dec. 29, 2017, now U.S. Pat. No. 10,964,532 issued Mar. 30, 2021, which is a divisional of U.S. patent application Ser. No. 15/235,365, filed Aug. 12, 2016, now U.S. Pat. No. 9,865,456, issued Jan. 9, 2018, the disclosure of each of which is hereby incorporated herein in its entirety by this reference.

TECHNICAL FIELD

Embodiments disclosed herein relate to semiconductor fabrication including atomic layer deposition of silicon nitride, semiconductor structures including the silicon nitride, and methods of forming the semiconductor structures. More particularly, embodiments of the disclosure relate to low temperature methods of forming the silicon nitride by atomic layer deposition, semiconductor structures including the silicon nitride, methods of forming the semiconductor structures, and silicon precursors for atomic layer deposition.

BACKGROUND

Silicon nitride (SiN) is a widely used material in the manufacture of integrated circuits (ICs). Due to its low reactivity and high thermal stability, silicon nitride is used as an insulating material, a mask material, an etch-stop material, a barrier material, a spacer material, etc.

Techniques for forming SiN include physical vapor deposition (PVD) and chemical vapor deposition (CVD), such as high temperature thermal CVD, plasma-enhanced CVD (PECVD), low pressure CVD (LPCVD), or low temperature thermal atmospheric pressure CVD (APCVD). In one process, silane ($SiH_4$) is reacted with ammonia ($NH_3$) to form the SiN. Other silicon precursors may be used, such as silicon halides. Examples of silicon halides include silicon tetrachloride ($SiCl_4$), dichlorosilane ($SiCl_2H_2$), trichlorosilane ($SiHCl_3$), silicon tetraiodide ($SiI_4$), $HSiI_3$, $H_2SiI_2$, $H_3SiI$, $H_2Si_2I_4$, $H_4Si_2I_2$, or $H_5Si_2I$. To produce high quality SiN, the PVD and CVD processes are conducted at a high temperature, usually greater than 750° C. However, these temperatures are not compatible with materials used in current ICs, some of which are thermally sensitive. Additionally, using a silicon halide as the silicon precursor is not desirable because reactive halide species, such as hydrochloric acid (HCl), are produced as byproducts. The reactive halide species are known to etch materials used in semiconductor fabrication, such as silicon-containing materials. The silicon halides are also known to degrade (e.g., corrode) equipment used in semiconductor fabrication.

Additional techniques for forming SiN on complex topographies have been developed as miniaturization of ICs continues. Atomic layer deposition (ALD) has been used to form SiN. The silane, silicon halide, and $NH_3$ CVD precursors are sufficiently reactive at temperatures greater than 450° C. or in a plasma environment to form SiN by ALD. However, the precursors are not sufficiently reactive to be used at lower temperatures or without a plasma. While plasma-enhanced ALD (PEALD) has been used to form SiN, step coverage of the SiN is not sufficiently conformal to cover the complex topographies present in current ICs. PEALD precursors include $H_{2n+2-y-z-w}Si_nX_yA_zR_w$, where n is 1-10, y is 1 or more, z is 0 or more, w is 0 or more, X is iodine or bromine, and A is a halogen other than X, and R is an organic ligand. In addition, hydrogen is incorporated into the SiN, which decreases its desirable properties. Furthermore, excited species created during the plasma portion of the PEALD process are not selective to exposed materials on the ICs and, therefore, unintended reactions occur between the excited species and the exposed materials.

Amine-based precursors, such as bis(diethylamino)silane (BDEAS) and bis(tertiarybutylamino)silane (BTBAS), have also been investigated as ALD precursors to form SiN. However, reactions using these amine-based precursors have a high activation energy and, therefore, ALD of the SiN cannot be conducted at a low temperature.

$SiI_4$ has also been used as a precursor to form SiN by ALD. While SiN is formed, the resulting SiN is not of sufficient quality to be used in ICs having complex topographies.

SiN formation becomes more complex as the size of ICs continues to decrease and the topographies become more challenging. As requirements for forming SiN become more stringent, the techniques mentioned above have not been able to form the SiN at the desired degree of conformality and at low temperatures.

DETAILED DESCRIPTION

Methods of forming high quality, silicon nitride (SiN) on a substrate at a low temperature are disclosed, as are semiconductor structures including the SiN and methods of forming the semiconductor structures. The SiN is formed by atomic layer deposition (ALD) at a temperature of less than or equal to about 275° C. The ALD formation of the SiN is referred to herein as a SiN formation act. No plasma is used during the SiN formation act. After formation, the SiN is exposed to a plasma treatment, which is referred to herein as a plasma treatment act. Compared to SiN prepared by conventional PVD, conventional CVD, or conventional ALD processes, the SiN formed by embodiments of the disclosure exhibit increased adhesion to underlying materials, increased step coverage, increased wet etch rate resistance, increased resistance to steam, and increased resistance to hydrogen ($H_2$) plasma. The resulting SiN also exhibits a uniform composition and a high degree of conformality, and is formed at a thickness controlled to within a few angstroms (Å).

As used herein, the term "silicon nitride" means and includes a compound including silicon atoms and nitrogen atoms. The silicon nitride may include stoichiometric amounts of silicon and nitrogen, such as $Si_3N_4$, or may include non-stoichiometric amounts of silicon and nitrogen, such as $Si_xN_y$, where each of x and y is independently a rational number from about 0.5 to about 2.0. The silicon nitride may also include $Si(CH)_xN_y$, where each of x and y is independently a rational number from about 0.5 to about 2.0. Small amounts of hydrogen, such as from about 4 atomic % to about 12 atomic %, may be present in the SiN. Small amounts of iodine or bromine, such as less that about 1 atomic %, may be present in the SiN.

As used herein, the term "substrate" means and includes a base material or construction upon which additional materials are formed. The substrate may be a semiconductor substrate, a base semiconductor layer on a supporting structure, a metal electrode, or a semiconductor substrate having one or more materials, layers, structures, or regions formed thereon. The materials on the semiconductor structure may include, but are not limited to, semiconductive materials, insulating materials, conductive materials, etc. One or more of the materials may be thermally sensitive. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

As used herein, the term "aspect ratio" means and includes a ratio of a height of a feature to a width of the feature.

The SiN formed by embodiments of the disclosure may have a high degree of conformality, such as greater than about 80% step coverage, greater than about 85% step coverage, greater than about 90% step coverage, or greater than about 95% step coverage. The high degree of conformality enables the SiN to be formed on high density, high aspect ratio (HAR) semiconductor structures. Since the SiN is formed at a low temperature and without using a plasma, the formation of the SiN by embodiments of the disclosure is compatible with sensitive materials on the substrate that may be exposed during the formation of the SiN.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of a semiconductor structure or a complete process flow for manufacturing semiconductor structures and the structures described below do not form a complete semiconductor structure. Only those process acts and structures necessary to understand the embodiments described herein are described in detail below. Additional acts to form a complete semiconductor structure including the structures described herein may be performed by conventional techniques.

The SiN is formed by ALD on the substrate by two or more SiN formation acts and two or more plasma treatment acts. A portion of the SiN is initially formed on the substrate by ALD at a temperature of less than or equal to about 275° C. The initial SiN portion is subjected to a plasma treatment before forming another portion or portions of the SiN. The other portion or portions of SiN are formed on the SiN portion by ALD at a temperature of less than or equal to about 275° C., followed by a plasma treatment of each portion. The SiN formation and plasma treatment acts may be repeated until a desired thickness of the SiN is achieved. Each of the SiN formation acts is conducted in a plasma free environment. That is, no plasma is generated in a reactor during the formation of the SiN portions. The reactor may be a conventional reaction chamber or a conventional deposition chamber, such as a conventional ALD reactor, which is not described in detail here. A plasma is, however, used during the plasma treatment acts following the SiN formation acts. Alternatively, the two or more portions of SiN may be formed and then all the SiN portions subjected to a single plasma treatment.

Before forming the SiN, the substrate may, optionally, be exposed to ammonia ($NH_3$) gas to prepare the substrate surface. The $NH_3$ may be introduced into the reactor containing the substrate and the substrate exposed to the $NH_3$ for an amount of time sufficient for the substrate and $NH_3$ to react. The contact time between the substrate and the $NH_3$ may range from about 10 seconds to about 180 seconds. The substrate may be exposed to the $NH_3$ at a temperature of from about 150° C. to about 250° C. and at a pressure of from about 1 Torr to about 10 Torr. Without being bound by any theory, the $NH_3$ is believed to react with and prepare the surface of the substrate for the SiN formation. By way of example only, the $NH_3$ may provide the substrate surface with a desired surface termination before forming the SiN portions on the substrate.

To form the SiN portions by ALD, a silicon precursor and a nitrogen precursor may be used to form silicon monolayers and nitrogen monolayers, respectively, on a surface of the substrate. The silicon precursor is used as the source of silicon and the nitrogen precursor is used as the source of nitrogen for the SiN. The silicon precursor and nitrogen precursor may be sufficiently reactive that a plasma is not needed to form the silicon monolayers and the nitrogen monolayers. Therefore, the silicon monolayers and the nitrogen monolayers of the SiN may be formed without generating a plasma while the silicon precursor and nitrogen precursor are present in the reactor. The silicon precursor and the nitrogen precursor may be sequentially introduced into the reactor containing the substrate, and the silicon and nitrogen precursors contacted with the substrate surface to form the silicon monolayers and nitrogen monolayers. The silicon precursor may be formulated to exhibit a sufficient stability such that the silicon precursor does not decompose or participate in secondary reactions at the processing temperature while also being sufficiently reactive to react with (e.g., chemisorb to) the surface of the substrate. The silicon precursor may be stable upon heating and produce a vapor pressure sufficient to provide a saturating dose of the silicon precursor without decomposition. Each of the silicon precursor and nitrogen precursor may be formulated to form on (e.g., chemisorb to) sites on the surface of the substrate or on underlying silicon or nitrogen monolayers in a self-limiting manner, producing the silicon monolayers and nitrogen monolayers, respectively. Sequentially forming the silicon and nitrogen monolayers may be repeated until a desired thickness of the SiN is achieved.

While the SiN formation acts are described herein as introducing the silicon precursor into the reactor and then introducing the nitrogen precursor, the order of introducing the silicon precursor and nitrogen precursor may be reversed such that the nitrogen precursor is introduced into the reactor, contacted with the surface of the substrate, and excess unreacted nitrogen precursor purged from the reactor to form the nitrogen monolayer on the substrate. Then, the silicon precursor may be introduced into the reactor, contacted with the nitrogen monolayer, and excess unreacted silicon precursor purged from the reactor to form the silicon monolayer on the nitrogen monolayer.

The SiN formation acts may be conducted at a temperature of less than or equal to about 275° C., such as less than or equal to about 250° C. The temperature may range from about 90° C. to about 275° C., such as from about 100° C. to about 275° C., from about 200° C. to about 275° C., or from about 200° C. to about 250° C. The temperature within the reactor and of the substrate may be less than or equal to about 275° C. during the SiN formation acts. The low temperature at which the SiN is formed may reduce the thermal budget relative to that of conventional high temperature thermal CVD, PECVD, or PVD processes of forming SiN. The low temperature may also enable the SiN to be conformally formed although sensitive materials are present on the substrate. Without limitation, the sensitive materials may include, but are not limited to, chalcogenide materials, organic (e.g., carbon) materials, carbon allotropes (e.g., graphite), reactive metals (e.g., tungsten, aluminum, or tantalum) or other sensitive materials. Thus, the SiN may be formed adjacent to such sensitive materials without degrading, decomposing, or otherwise negatively affecting the materials.

To form the silicon monolayers of the initial SiN portion, the silicon precursor may be introduced into the reactor as a solid or a liquid, heated to a reactant vapor, and contacted with the substrate surface or with the nitrogen monolayers. A monolayer or less of the silicon may be formed on the substrate or on the nitrogen monolayers. The reactor may be maintained at a pressure of from about 1 Torr to about 40 Torr, such as at about 20 Torr during the SiN formation acts. The silicon precursor may be introduced into the reactor at a flow rate of from about 1 standard cubic centimeters (sccm) to about 2000 sccm, such as from about 1 sccm to about 1000 sccm. The silicon precursor may be introduced into the reactor with a carrier gas, such as helium, nitrogen, argon, xenon, carbon monoxide, or combinations thereof. The carrier gas may be introduced into the reactor at a flow rate of from about 1 sccm to about 500 sccm, such as at a flow rate of about 300 sccm. The silicon precursor may remain in the reactor for an amount of time sufficient for the silicon to contact and chemisorb to the substrate surface or to the nitrogen monolayers and form the silicon monolayers. By way of example only, the silicon precursor may remain in the reactor for from about 0.01 second to about 100 seconds, such as from about 10 seconds to about 25 seconds. In one embodiment, the silicon precursor remains in the reactor for about 10 seconds. The silicon precursor may, optionally, remain in the reactor for a longer amount of time to ensure substantially complete nucleation.

The silicon precursor may include silicon atoms and one or more of hydrogen atoms, carbon atoms, nitrogen atoms, or combinations thereof. The silicon precursor may be a brominated or iodinated silane or a silylene compound. The brominated silane or iodinated silane may include, but is not limited to, silicon tetraiodide (SiI$_4$), silicon tetrabromide (SiBr$_4$), or combinations thereof. In some embodiments, the silicon precursor is SiI$_4$. In other embodiments, the silicon precursor is SiBr$_4$. The silylene compound may be a silicon-containing compound having a divalent silicon atom and no overall electrical charge. The silylene compound may be saturated or unsaturated (i.e., include a carbon-carbon double bond). In yet other embodiments, the silylene precursor is N,N'-di-tert-butyl-1,3-diaza-2-silacyclopent-4-en-2-ylidene, which has the chemical structure below:

For simplicity and convenience, the precursors are collectively referred to herein as the "silicon precursors" while the individual precursors are referred to as tetraiodosilane, tetrabromosilane, or the silylene compound. The silicon precursors may be commercially available from numerous sources, such as Alfa Aesar (Ward Hill, Mass.), Gelest, Inc. (Morrisville, Pa.), Sigma-Aldrich Co. LLC (St. Louis, Mo.), or Strem Chemicals, Inc. (Newburyport, Mass.).

Excess unreacted silicon precursor may then be removed (e.g., purged) from the reactor. The unreacted silicon precursor may be removed by introducing an inert gas into the reactor, such as helium, argon, xenon, or combinations thereof. The inert gas may be flowed into the reactor at a flow rate of from about 1 sccm to about 100 sccm, such as at about 25 sccm. The reactor may be purged for from about 5 seconds to about 30 seconds at a pressure of from about 1 Torr to about 10 Torr, such as at about 2 Torr. In some embodiments, the silicon precursor is purged from the reactor for about 30 seconds.

To form the nitrogen monolayers of the initial SiN portion, the nitrogen precursor may be introduced into the reactor as a solid or a liquid, heated to a reactant vapor, and contacted with the silicon monolayers. A monolayer or less of the nitrogen may be formed on the silicon monolayers. The reactor may be maintained at a pressure of from about 1 Torr to about 40 Torr, such as at about 20 Torr. The nitrogen precursor may be introduced into the reactor at a flow rate of from about 1 sccm to about 2000 sccm, such as from about 1 sccm to about 1000 sccm. The nitrogen precursor may be introduced into the reactor with the carrier gas, which is flowed at a flow rate of from about 1 sccm to about 2000 sccm, such as at a flow rate of about 1000 sccm. The nitrogen precursor may remain in the reactor for an amount of time sufficient for the nitrogen to form the nitrogen monolayers. By way of example only, the nitrogen precursor may remain in the reactor for from about 10 seconds to about 25 seconds. In some embodiments, the nitrogen precursor remains in the reactor for about 5 seconds.

The nitrogen precursor may be NH$_3$, hydrazine (N$_2$H$_4$), t-butyl hydrazine, a monoalkylhydrazine, a dialkylhydrazine, or combinations thereof. In some embodiments, the nitrogen precursor is NH$_3$.

Excess unreacted nitrogen precursor may then be removed (e.g., purged) from the reactor by introducing an inert gas into the reactor, such as helium, argon, xenon, or combinations thereof. The inert gas may be flowed into the reactor at a flow rate of from about 1 sccm to about 100 sccm, such as at about 25 sccm. The reactor may be purged for from about 5 seconds to about 30 seconds at a pressure of from about 1 Torr to about 10 Torr, such as at about 2 Torr. In some embodiments, the excess nitrogen precursor is purged from the reactor for about 30 seconds.

The pressures, flow rates, and times described above may be increased or decreased depending on one or more of the volume of the reactor, efficiency of introducing the silicon and nitrogen precursors, pumping efficiency, batch furnace configurations, materials of the substrate underlying the SiN, and other factors known in the art.

The monolayers of silicon and nitrogen may be sequentially formed as described above until a desired thickness of the initial portion of SiN is achieved. The initial portion of SiN may be formed at a minimum thickness, such as at a thickness of at least about 50% of a total thickness of the SiN. The thickness of the initial SiN portion may be sufficient to substantially completely cover materials underlying the SiN, which prevents or reduces damage to the underlying materials during subsequent processing. The thickness of the initial SiN portion may account for from about 80% to about 90% of the total thickness of the SiN. In some embodiments, the initial portion of SiN is formed to a thickness of about 20 Å.

Without being bound by any theory, reaction of one of the above-mentioned silicon precursors with the nitrogen precursor, such as $NH_3$, exhibits a high exothermicity and lower energy barrier than that of a chlorosilane, such as tetrachlorosilane ($SiCl_4$), with $NH_3$. Since the reactions have a lower energy barrier, the above silicon precursors are suitable for use as low temperature (i.e., less than or equal to about 275° C.) ALD precursors.

After formation, the initial portion of SiN may be exposed to a plasma treatment. The plasma may be generated in the reactor (e.g., a direct plasma) or the plasma may be generated outside the reactor and supplied to the reactor (e.g., a remote plasma). The plasma may be of an inert species, such as helium, argon, xenon, or combinations thereof, of a reactive species, such as nitrogen ($N_2$), hydrogen ($H_2$), or combinations thereof, or of combinations of the inert species and the reactive species. The plasma may be produced by conventional techniques, which are not described in detail herein. The plasma produces radicals and other species that react with and modify the initial portion of SiN. The plasma species may be selected based on the material(s) underlying the SiN. In some embodiments, the plasma includes $N_2$ and helium. The plasma may be an inductively coupled plasma (ICP), a capacitively coupled plasma (CCP), or combinations thereof. The plasma may be operated at a frequency of from about 400 kHz to about 30 MHz. In some embodiments, the frequency is about 13.56 MHz. The plasma has a power of from about 150 W to about 600 W. The frequency and power may be selected depending on the reactor design and plasma mode of operation, as well as the materials of the substrate underlying the SiN. The pressures, flow rates, and times described above may be increased or decreased depending on one or more of the volume of the reactor, efficiency of introducing the silicon and nitrogen precursors, pumping efficiency, batch furnace configurations, and other factors known in the art.

After plasma treating the initial portion of SiN, the other portion or portions of SiN may be formed by ALD at a temperature of less than or equal to about 275° C. on the initial SiN portion, followed by plasma treatment of the other portion or portions. The other portion or portions of SiN may be formed as described above for the initial SiN portion, except that a thickness of the other portion or portions may be less than a thickness of the initial SiN portion. The plasma treatment of each portion of SiN may be conducted as described above. The number of additional portions of SiN formed and the number of plasma treatments conducted may be selected depending on the intended use of the SiN as described in more detail below. The SiN formation and plasma treatment acts may be repeated until the desired total thickness of the SiN is achieved.

The initial SiN portion and the subsequently formed SiN portions may be subjected to the plasma treatments to modify the SiN. Without being bound by any theory, it is believed that exposing the as-formed SiN portions to the plasma treatments increases the density of the SiN, which provides improved adhesion, increased step coverage, increased wet etch rate resistance, increased resistance to steam, and increased resistance to $H_2$ plasma to the SiN. The plasma treatments may also decrease the impurities in the SiN, such as hydrogen, iodine, or bromine impurities. Thus, the quality of the SiN formed by embodiments of the disclosure is higher compared to SiN formed by conventional techniques.

The ability of the plasma treatments to increase the quality of the SiN was unexpected because the plasma was expected to degrade (e.g., decompose) the materials underlying the SiN and also degrade (e.g., corrode) equipment, such as the reactor. Since, however, the plasma treatment acts are conducted when no silicon and nitrogen precursors are present (i.e., the silicon and nitrogen precursors are removed from the reactor following the SiN formation acts), no reactive halide species are present to degrade, decompose, or otherwise negatively affect the underlying sensitive materials or equipment. Thus, no halide byproduct contamination is observed during the SiN formation.

Accordingly, a method of forming SiN is disclosed. The method comprises forming silicon nitride on a substrate by atomic layer deposition at a temperature of less than or equal to about 275° C. The as-formed silicon nitride is exposed to a plasma.

Accordingly, another method of forming SiN is disclosed. The method comprises forming a portion of silicon nitride by atomic layer deposition on a substrate. The portion of silicon nitride is formed by contacting a silicon precursor comprising a brominated silane, an iodinated silane, a silylene compound, or combinations thereof and a nitrogen precursor comprising ammonia with the substrate. The portion of silicon nitride is exposed to a plasma treatment. At least one other portion of silicon nitride is formed by atomic layer deposition on the portion of silicon nitride. The at least one other portion of silicon nitride is formed by contacting a silicon precursor comprising a brominated silane, an iodinated silane, a silylene compound, or combinations thereof and a nitrogen precursor comprising ammonia with the portion of silicon nitride. The at least one other portion of silicon nitride is exposed to a plasma treatment.

Accordingly, a silicon precursor comprising a silylene compound is disclosed. The silylene compound comprises N,N'-di-tert-butyl-1,3-diaza-2-silacyclopent-4-en-2-ylidene.

The illustrations included herewith are not meant to be actual views of any particular semiconductor structure, but are merely idealized representations that are employed to describe embodiments herein. Thus, the illustrations may not be drawn to scale.

Figure 1:
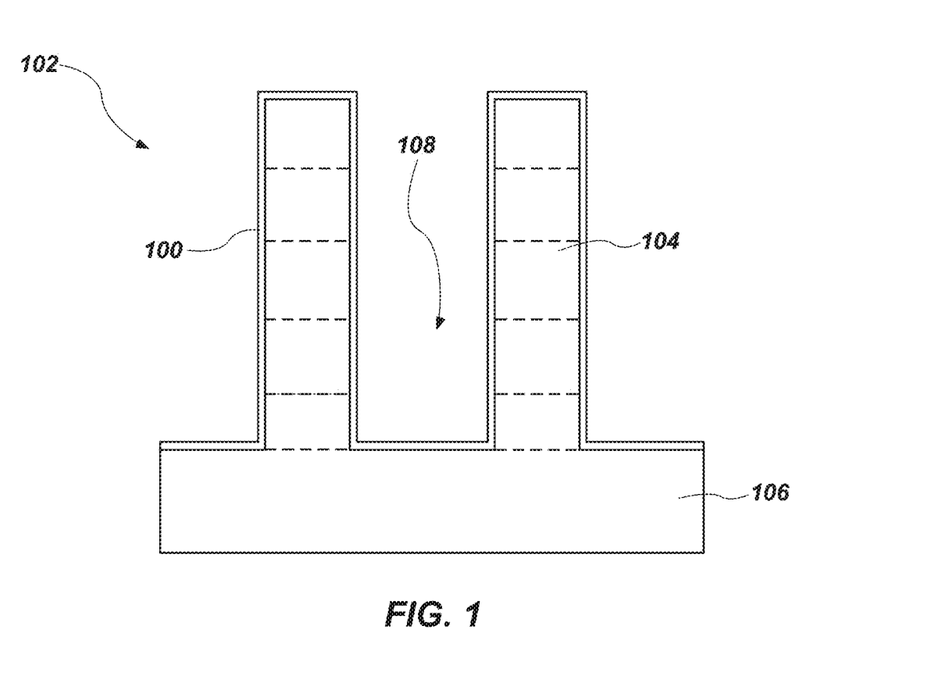
FIG. 1 is a simplified cross-sectional view of a semiconductor structure including a silicon nitride material formed in accordance with embodiments of the disclosure.

The SiN formed by embodiments of the disclosure may be used in a semiconductor structure having at least one feature with a high aspect ratio. As shown in FIG. 1, a semiconductor structure 102 includes SiN 100, at least one feature 104 with a high aspect ratio, and a substrate 106 having openings 108 therein that define the features 104. The SiN 100 may be conformally formed on the features 104. Depending on the intended application for the SiN 100, the substrate 106 may be a semiconductive material, an insulating material, or a conductive material. By way of example only, the semiconductive material may be silicon, hydrogen-doped silicon, a silicon oxide, hydrogen-doped silicon oxide, gallium, etc. The insulating material may include, but is not limited to, silicon dioxide, hafnium oxide, or aluminum oxide. The conductive material may include, but is not limited to, a metal, a conductively-doped silicon, a conductively-doped germanium, a metal silicide, a metal carbide, a phase change material, etc. The material of the substrate 106 may be formed by conventional techniques, such as physical vapor deposition (PVD), chemical vapor deposition (CVD), or ALD. Such techniques are known in the art and, therefore, are not described in detail herein. As shown in FIG. 1, the features 104 are formed from the material of the substrate 106. However, the substrate 106 may include one or more materials, layers, structures, or regions thereon, such as a stack structure, which makes up the features 104. Multiple materials of the features 104 are indicated in FIG. 1 by the dashed lines. The materials of the stack structure may be formed by conventional techniques, which are not described in detail herein. The features 104 may have a high aspect ratio, such as an aspect ratio of at least about 10:1, such as at least about 12:1, at least about 13:1, or at least about 15:1. The SiN 100 may be formed over the features 104 according to embodiments of the disclosure. The SiN may be formed at a total thickness ranging from about 3 nm (30 Å) to about 100 nm (1000 Å), such as from about 4 nm to about 20 nm or from about 4 nm to about 9 nm. However, the SiN may also be formed at greater thicknesses depending on a semiconductor device structure in which the SiN is to be used. The SiN 100 conformally formed on the features 104 may exhibit greater than about 80% step coverage, greater than about 85% step coverage, greater than about 90% step coverage, or greater than about 95% step coverage. The SiN 100 may, alternatively, be formed on the semiconductor structure 102 as a planar layer (not shown).

The SiN 100 of the semiconductor structure 102 may be used in a semiconductor device structure having at least one high aspect ratio feature, such as in a transistor, memory, logic device, memory array, etc. The SiN may be used in a semiconductor device structure including, but not limited to, a dynamic random access memory (DRAM) device, a not or (NOR) Flash memory device, or a three-dimensional (3D) cross-point memory device. The SiN 100 may be used in the semiconductor device structure as an insulating material, a mask material, an etch-stop material, a barrier material, or a spacer material. The process conditions and the ALD precursors used for the SiN formation acts and the process conditions used for the plasma treatment acts may be selected depending on the semiconductor device structure to be formed and the desired adhesion, step coverage, wet etch rate resistance, resistance to steam, and resistance to $H_2$ plasma properties of the SiN 100. The semiconductor device structure including the SiN 100 may be formed by tailoring the conditions of the SiN formation acts and the plasma treatment acts. By way of example only, if the SiN 100 is to be used in a DRAM device, the SiN 100 may be formed at a temperature of about 250° C., while if the SiN 100 is to be used in a 3D cross-point memory device, the SiN 100 may be formed at a temperature of about 200° C. By way of example only, the plasma treatment acts to be used in the fabrication of a DRAM device may be an ICP mode plasma, while the plasma treatment act to be used in the fabrication of a 3D cross-point memory device may be a CCP mode plasma.

Additional process acts may be conducted to form a complete semiconductor device structure. The additional process acts may be formed by conventional techniques, which are not described in detail herein.

Accordingly, a method of forming a semiconductor structure is disclosed. The method comprises forming silicon nitride by atomic layer deposition at a temperature of less than or equal to about 275° C. on at least one feature on a substrate. The at least one feature has an aspect ratio of greater than about 10:1. The as-formed silicon nitride is exposed to a plasma.

Accordingly, a semiconductor structure is disclosed. The semiconductor structure comprises at least one feature on a substrate and silicon nitride on the at least one feature. The at least one feature has an aspect ratio of greater than about 10:1 and the silicon nitride exhibits a step coverage of greater than about 85%.

The following examples serve to explain embodiments of the disclosure in more detail. These examples are not to be construed as being exhaustive or exclusive as to the scope of this disclosure.

EXAMPLES

Example 1

SiN Formation

SiN was formed on a substrate including HAR stacks having an aspect ratio of 12:1. At least some of the materials in the stacks included thermally sensitive materials. The SiN was deposited on the HAR stacks using an Applied Materials ENDURA® frame equipped with an ALD funnel-lid chamber. The substrate was exposed to $NH_3$ for 30 seconds before starting the SiN ALD deposition. The chuck was maintained at a temperature of 200° C. during the ALD deposition. An initial portion of SiN was formed on sidewalls of the HAR stacks by conducting 90 cycles of: introducing $SiI_4$ into the chamber for 10 seconds, followed by a purge of 30 seconds, introducing the $NH_3$ into the chamber for 5 seconds, followed by a purge of 30 seconds. The initial SiN portion was exposed to a first plasma treatment that included an $N_2$ and He plasma for 60 seconds, where the plasma was produced in the ICP mode at 300 W. A second portion of SiN was formed by conducting 30 loops of: introducing the $SiI_4$ into the chamber for 10 seconds, followed by a purge of 30 seconds, introducing the $NH_3$ into the chamber for 5 seconds, followed by a purge of 30 seconds. The substrate was subjected to a second plasma treatment including an $N_2$ and He plasma for 60 seconds, where the plasma was produced in the ICP mode at 300 W. A third portion of SiN was formed by 30 loops of: introducing the $SiI_4$ into the chamber for 10 seconds, followed by a purge of 30 seconds, introducing the $NH_3$ into the chamber for 5 seconds, followed by a purge of 30 seconds. The substrate was subjected to a third plasma treatment including an $N_2$ and He plasma for 60 seconds, where the plasma was produced in the ICP mode at 300 W.

Example 2

SiN Formation

The ALD deposition and plasma treatment acts were conducted as described in Example 1 except that the substrate was not exposed to $NH_3$ before starting the ALD deposition of the SiN.

Example 3

Adhesion, Step Coverage, Wet Etch Rate, and Steam Resistance Properties

Figure 2:
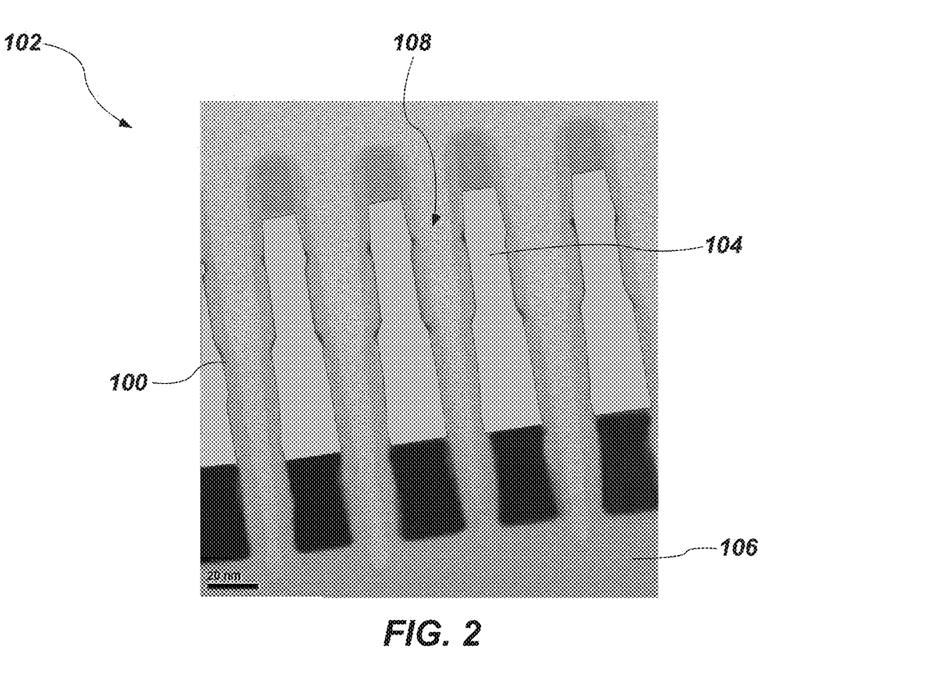
FIG. 2 is a tunneling electron micrograph (TEM) of silicon nitride formed over a 12:1 high aspect ratio structure in accordance with embodiments of the disclosure.

A tunneling electron micrograph (TEM) of the SiN deposited as described in Example 1 is shown in FIG. 2. Good adhesion of the SiN to the materials of the HAR stacks was observed, even though the HAR stacks included at least five different materials. As shown in FIG. 2, the SiN adhered to the sidewalls of the HAR stacks along their entire length.

Step coverage of the SiN deposited as described in Example 1 was measured to be at least about 85%. In many locations, the step coverage was greater than about 90%.

The SiN deposited as described in Example 1 had a wet etch rate of between about 1.0 Å/min and about 2.5 Å/min in a 2000:1 solution of water:HF. By way of comparison, SiN formed by conventional techniques exhibits a wet etch rate of about 1.0 Å/min. Thus, the SiN had a comparable wet etch rate resistance compared to SiN formed by conventional techniques.

Figure 3:
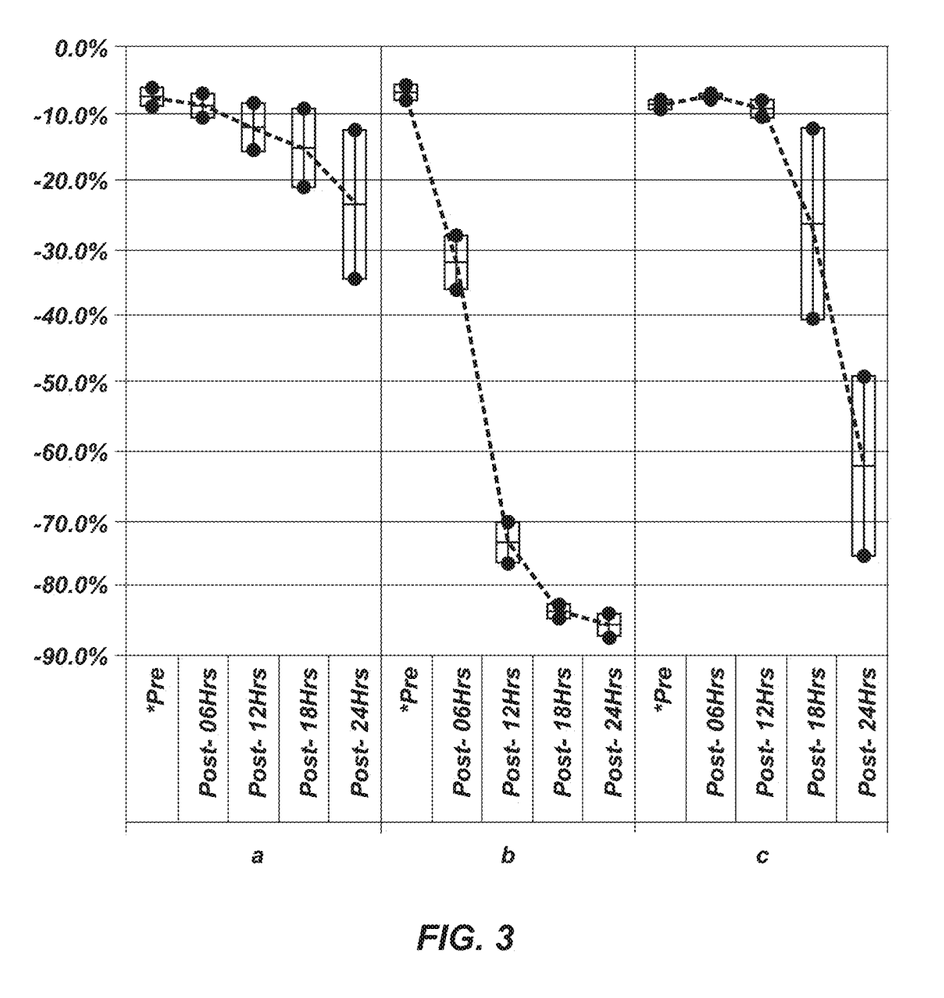
FIG. 3 is a plot of the percentage of SiN loss as a function of time following exposure to steam.

The SiN deposited as described in Example 1 (Sample a) exhibited an increased resistance to steam compared to control samples (Samples b and c) not exposed to the plasma treatments, as shown in FIG. 3. The SiN of the control samples was deposited at 250° C. The SiN deposited as described in Example 1 and the SiN of the control samples was exposed to a steam anneal at 300° C. and the percentage of SiN loss was measured at different times following the steam anneal. FIG. 3 shows a plot of the percentage of SiN loss as a function of time following the steam anneal. The SiN deposited as described in Example 1 (Sample a) showed a lower loss than the two control samples (Samples b and c) and, thus, exhibited an increased resistance to steam.

Example 4

$H_2$ Plasma Resistance

Figure 4:
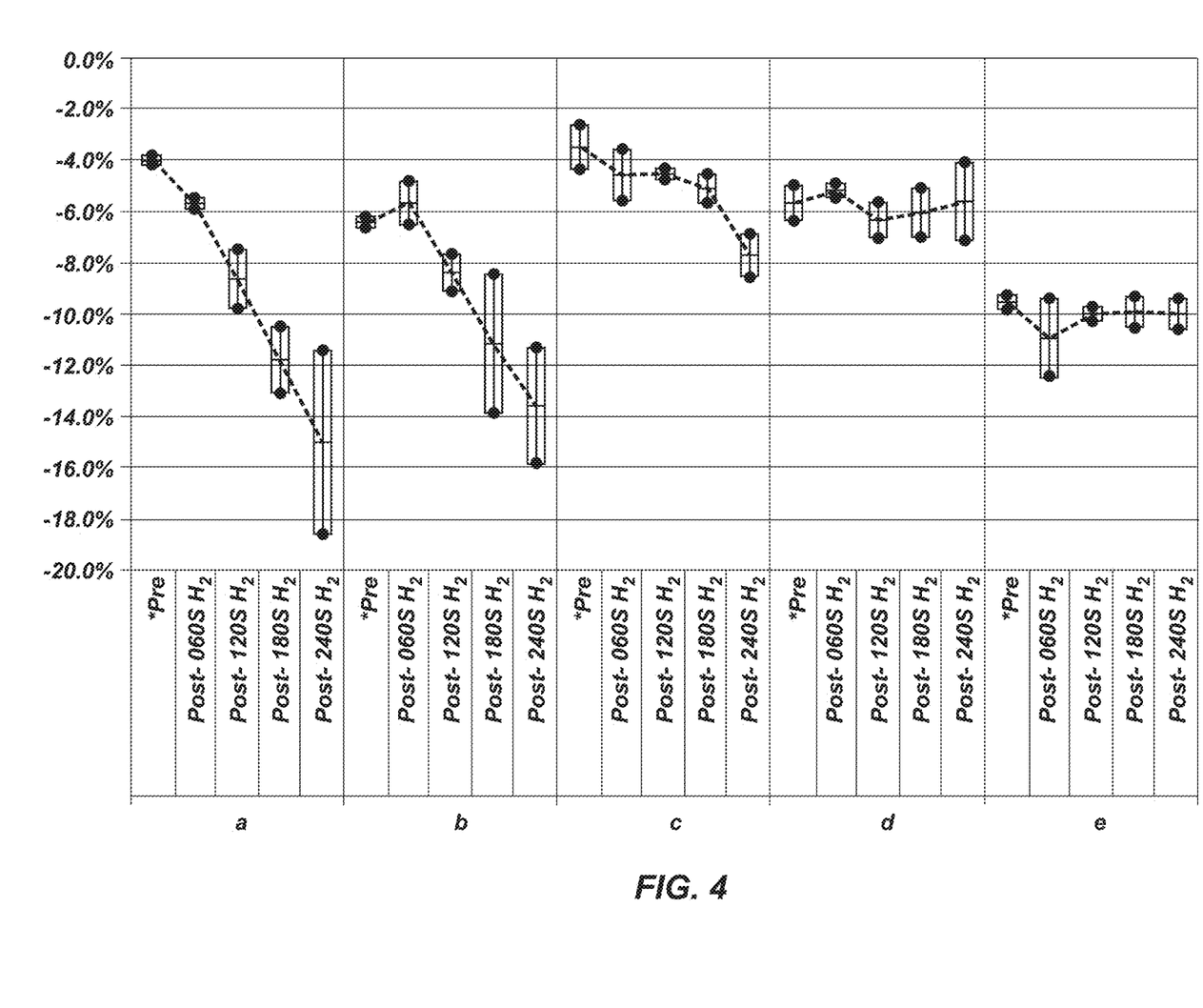
FIG. 4 is a plot of the percentage of SiN loss as a function of time following exposure to an $H_2$ plasma.

SiN was deposited as described in Example 1 except that the plasma treatments included exposure to an Ar—He plasma for 20 seconds (Sample c) or for 40 seconds (Sample d). The resulting SiN (Samples c and d) was exposed to a $H_2$ plasma and the percentage of SiN loss was measured at different times following the $H_2$ plasma exposure. Samples a and b included SiN deposited as described above for Samples c and d but exposed to different plasmas and/or having different exposure times. FIG. 4 shows a plot of the percentage of SiN loss as a function of time following the $H_2$ plasma exposure for the SiN and for a control sample (Sample e). The SiN of Samples c and d exhibited an increased resistance to the $H_2$ plasma compared to a control sample (Sample e) of SiN that was formed by conventional techniques.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A method of forming silicon nitride, comprising:
    forming a portion of silicon nitride by atomic layer deposition on a material, the portion of silicon nitride formed by:
        contacting the material with a silicon precursor comprising a brominated silane, an iodinated silane, a silylene compound, or a combination thereof and a reactant vapor nitrogen precursor;
    forming at least one other portion of silicon nitride by atomic layer deposition on the portion of silicon nitride, the at least one other portion of silicon nitride formed by:
        contacting the portion of silicon nitride with another silicon precursor comprising a brominated silane, an iodinated silane, a silylene compound, or a combination thereof and another reactant vapor nitrogen precursor; and
    exposing the portion of silicon nitride and the at least one other portion of silicon nitride to a plasma.

2. The method of claim 1, wherein forming a portion of silicon nitride by atomic layer deposition on a material and forming at least one other portion of silicon nitride by atomic layer deposition on the portion of silicon nitride comprises forming the portion of silicon nitride and the at least one other portion of silicon nitride in a plasma-free environment.

3. The method of claim 1, wherein contacting the material with a silicon precursor comprises contacting the material with silicon tetraiodide, silicon tetrabromide, or a combination thereof.

4. The method of claim 1, wherein contacting the material with a silicon precursor comprises contacting the material with N,N'-di-tert-butyl-1,3-diaza-2-silacyclopent en-2-ylidene or a combination of the N,N'-di-tert-butyl-1,3-diaza-2-silacyclopent-4-en-2-ylidene with a brominated silane, an iodinated silane, or a silylene compound.

5. The method of claim 1, wherein forming a portion of silicon nitride by atomic layer deposition comprises forming the portion of silicon nitride to a thickness of at least about 50% of a total thickness of the silicon nitride.

6. The method of claim 1, wherein forming a portion of silicon nitride on a material and forming at least one other portion of silicon nitride on the portion of silicon nitride comprises forming the silicon nitride to a total thickness before exposing the portion of silicon nitride and the at least one other portion of silicon nitride to the plasma.

7. The method of claim 1, wherein forming a portion of silicon nitride by atomic layer deposition on a material and forming at least one other portion of silicon nitride by atomic layer deposition on the portion of silicon nitride comprises forming the portion of silicon nitride and the at least one other portion of silicon nitride at a temperature of from about 100° C. to about 275° C.

8. A method of forming silicon nitride, comprising:
    forming at least one feature on a material, the at least one feature comprising a chalcogenide material, an organic material, a carbon allotrope, a reactive metal material, or a combination thereof;
    contacting the at least one feature with a silicon precursor and a nitrogen precursor at a temperature of less than or equal to about 275° C. and in the absence of a plasma to form silicon monolayers and nitrogen monolayers on the at least one feature; and
    exposing the silicon monolayers and the nitrogen monolayers to a plasma to form silicon nitride on the at least one feature.

9. The method of claim 8, wherein contacting the at least one feature with a silicon precursor comprises contacting the at least one feature with a silicon precursor comprising silicon atoms and one or more of hydrogen atoms, carbon atoms, nitrogen atoms, or combinations thereof.

10. The method of claim 8, wherein contacting the at least one feature with a silicon precursor and a nitrogen precursor to form silicon monolayers and nitrogen monolayers comprises forming the silicon monolayers and nitrogen monolayers at a temperature of from about 100° C. to about 250° C.

11. The method of claim 8, wherein contacting the at least one feature with a silicon precursor and a nitrogen precursor comprises contacting the at least one feature with silicon tetraiodide.

12. The method of claim 8, wherein exposing the silicon monolayers and the nitrogen monolayers to a plasma comprises forming a portion of a total thickness of the silicon nitride before exposing the silicon monolayers and the nitrogen monolayers to the plasma.

13. The method of claim 8, wherein exposing the silicon monolayers and the nitrogen monolayers to a plasma comprises forming the silicon nitride to a total thickness before exposing the silicon monolayers and the nitrogen monolayers to the plasma.

14. The method of claim 8, wherein forming silicon nitride on the at least one feature comprises forming the silicon nitride exhibiting a thickness of from about 30 Å to about 1000 Å.

15. A method of forming silicon nitride, comprising:
forming silicon nitride on a material by atomic layer deposition at a temperature of less than or equal to about 275° C., the silicon nitride formed by contacting a silicon precursor and a nitrogen precursor with the material, the silicon precursor comprising one or more of a brominated silane or a silylene compound; and
exposing the as-formed silicon nitride to a plasma.

16. The method of claim 15, wherein forming silicon nitride on a material by atomic layer deposition at a temperature of less than or equal to about 275° C. comprises forming the silicon nitride exhibiting a step coverage of greater than about 90%.

17. The method of claim 15, wherein forming silicon nitride on a material by atomic layer deposition comprises forming the silicon nitride by atomic layer deposition at a temperature of from about 200° C. to about 250° C.

18. The method of claim 15, further comprising repeating the forming silicon nitride on a material by atomic layer deposition act and the exposing the as-formed silicon nitride to a plasma act to form the silicon nitride to a desired thickness.

19. The method of claim 15, wherein exposing the as-formed silicon nitride to a plasma comprises exposing the as-formed silicon nitride to a helium plasma, an argon plasma, a xenon plasma, a nitrogen ($N_2$) plasma, a hydrogen ($H_2$) plasma, or combinations thereof.

20. The method of claim 15, wherein forming silicon nitride on a material comprises forming a desired thickness of the silicon nitride on the material comprising one or more features.

* * * * *

UNITED STATES PATENT AND TRADEMARK OFFICE
CERTIFICATE OF CORRECTION

| | |
|---|---|
| PATENT NO. | : 11,651,955 B2 |
| APPLICATION NO. | : 17/215958 |
| DATED | : May 16, 2023 |
| INVENTOR(S) | : Sumeet C. Pandey et al. |

It is certified that error appears in the above-identified patent and that said Letters Patent is hereby corrected as shown below:

In the Specification

Column 3, Line 21, change "("SOT") substrates," to --("SOI") substrates,--

Column 11, Line 30, change "an Ar—He" to --an Ar-He--

In the Claims

Claim 4, Column 12, Line 25, change "silacyclopent en-2-" to --silacyclopent-4-en-2- --

Page 1 of 1

Signed and Sealed this
Eighth Day of August, 2023

Katherine Kelly Vidal
*Director of the United States Patent and Trademark Office*